(12) United States Patent
Terahara

(10) Patent No.: US 7,846,792 B2
(45) Date of Patent: Dec. 7, 2010

(54) METHOD FOR MANUFACTURING SEMICONDUCTOR DEVICE AND SEMICONDUCTOR DEVICE MANUFACTURING SYSTEM

(75) Inventor: Masanori Terahara, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 118 days.

(21) Appl. No.: 12/364,830

(22) Filed: Feb. 3, 2009

(65) Prior Publication Data
US 2009/0197355 A1 Aug. 6, 2009

(30) Foreign Application Priority Data
Feb. 6, 2008 (JP) .............................. 2008-026602

(51) Int. Cl.
*G01R 31/26* (2006.01)
*H01L 21/66* (2006.01)
*H01L 21/8242* (2006.01)
*H01L 21/20* (2006.01)

(52) U.S. Cl. .................... 438/248; 438/14; 438/391; 438/700; 257/E21.545; 257/E21.546; 257/E21.553; 257/E21.564

(58) Field of Classification Search .......... 257/E21.545, 257/E21.546, E21.553, E21.564
See application file for complete search history.

(56) References Cited

U.S. PATENT DOCUMENTS 6,204,146 B1 * 3/2001 Jenq ............................ 438/424
7,163,869 B2 * 1/2007 Kim et al. ................... 438/424

FOREIGN PATENT DOCUMENTS

| JP | 2002-151465 A | 5/2002 |
| JP | 2004-71862 A | 3/2004 |
| JP | 2006-4982 A | 1/2006 |
| JP | 2007-109966 A | 4/2007 |

* cited by examiner

*Primary Examiner*—Charles D Garber
*Assistant Examiner*—Mohsen Ahmadi
(74) *Attorney, Agent, or Firm*—Westerman, Hattori, Daniels & Adrian, LLP (57) ABSTRACT

A method for manufacturing a semiconductor device that controls the influence of a thickness of a stopper film even if there is a change in the thickness of the stopper film by measuring the thickness prior to etching to a predetermined thickness.

7 Claims, 9 Drawing Sheets

LIFETIME AND LIFE COUNT OF HYDROFLUORIC ACID SOLUTION

FIG. 6B

METHOD FOR MANUFACTURING SEMICONDUCTOR DEVICE AND SEMICONDUCTOR DEVICE MANUFACTURING SYSTEM

CROSS-REFERENCE TO RELATED APPLICATION

This application is based upon and claims the benefit of priority from the prior Japanese Patent Application No. 2008-26602 filed on Feb. 6, 2008, the entire contents of which are incorporated herein by reference.

BACKGROUND

1. Field

The present invention relates to a method for manufacturing a semiconductor device and a semiconductor device manufacturing system.

2. Description of the Related Art

Device isolation regions in semiconductor integrated circuit devices have generally been formed by shallow trench isolation (STI), in place of local oxidation of silicon (LOCOS) isolation.

In the STI, a device isolation trench is etched in a semiconductor substrate, the trench is filled with an insulating layer, and an unnecessary part of the insulating layer is removed by polishing to form a device isolation region. The STI does not produce bird's beaks.

FIGS. 1A to 1G are schematic cross-sectional views of a silicon substrate illustrating steps of forming a device isolation region by STI.

Figure 1A:
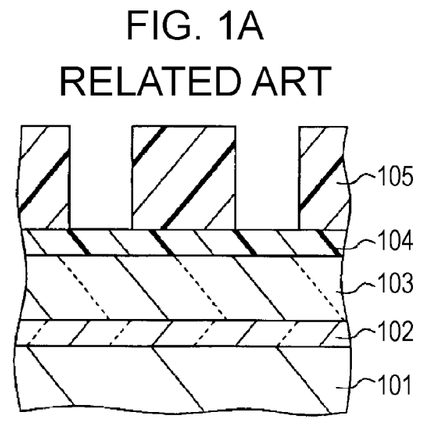
FIGS. 1A to 1G are schematic cross-sectional views of a silicon substrate illustrating main steps of forming device isolation regions by STI.

As illustrated in FIG. 1A, the surface of a silicon substrate 101 is thermally oxidized to form a buffer oxide layer 102 of silicon oxide. A silicon nitride layer 103 is formed on the buffer oxide layer 102 by chemical vapor deposition (CVD). The silicon nitride layer 103 functions as a hard mask in substrate etching and as a stopper in chemical mechanical polishing. A photoresist is applied to an organic antireflection layer 104 formed on the silicon nitride layer 103. The resulting photoresist layer is exposed and developed to form a resist pattern 105 having openings in device isolation regions. The antireflection layer 104, the silicon nitride layer 103, and the buffer oxide layer 102 are etched using the resist pattern 105 as an etching mask to form a hard mask. The resist pattern 105 and the antireflection layer 104 are then removed.

Figure 1B:
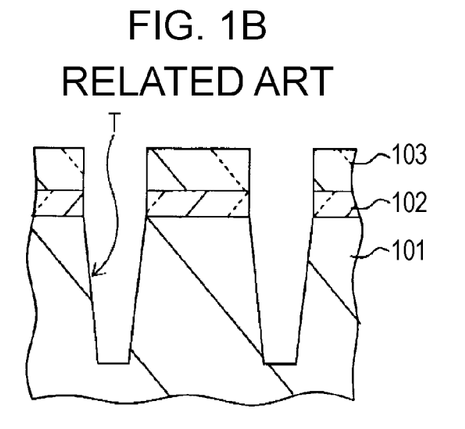

As illustrated in FIG. 1B, the silicon substrate 101 is etched using the hard mask as an etching mask to form trenches T.

Figure 1C:
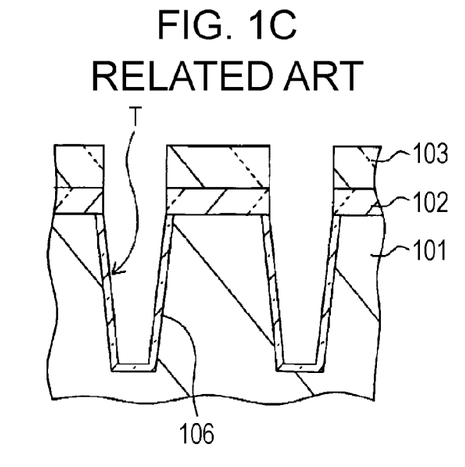

As illustrated in FIG. 1C, silicon surfaces of the trenches T are thermally oxidized to form silicon oxide liners 106.

Figure 1D:
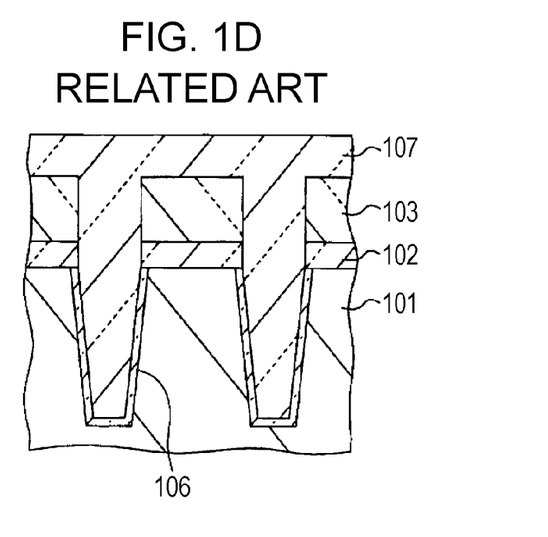

As illustrated in FIG. 1D, the trenches T are filled with a silicon oxide layer 107 by high-density plasma (HDP) CVD.

Figure 1E:
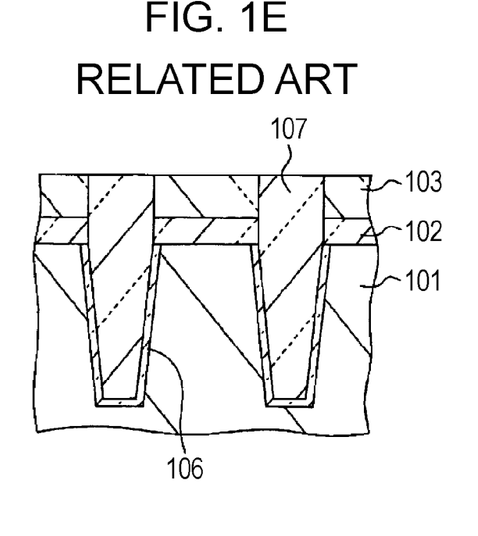

As illustrated in FIG. 1E, an unnecessary part of the silicon oxide layer 107 is removed by chemical mechanical polishing (CMP) using the silicon nitride layer 103 as a stopper to expose the silicon nitride layer 103. An active region is covered with the buffer oxide layer 102 and the silicon nitride layer 103.

Figure 1F:
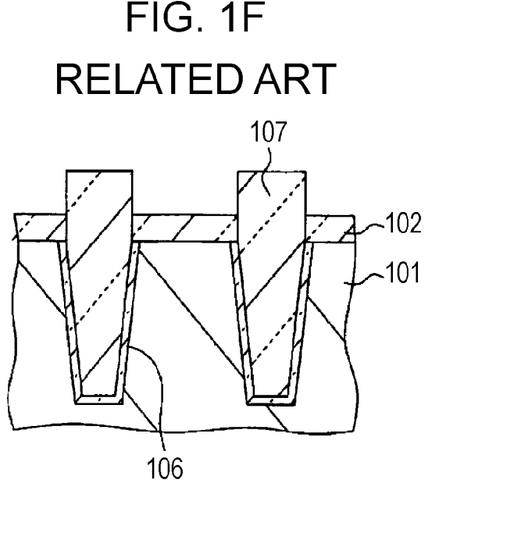

As illustrated in FIG. 1F, the silicon nitride layer 103 is removed by wet etching using boiling phosphoric acid. The buffer oxide layer 102 and the silicon oxide layer 107 are etched negligibly.

Figure 1G:
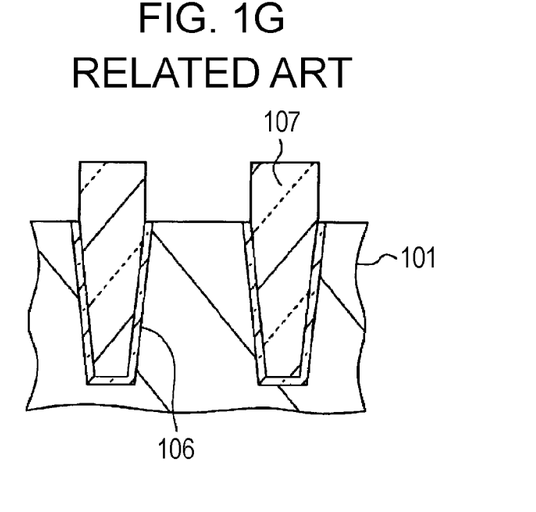

As illustrated in FIG. 1G, the buffer oxide layer 102 is removed using a hydrofluoric acid solution. The silicon oxide layer 107 in the device isolation regions is also etched. The height of the silicon oxide layer 107 in the device isolation regions is controlled by over-etching of silicon oxide. Subsequent steps involve thermal oxidation of the surface of the active region, ion implantation to form wells, and removal of an oxide layer. The surface of the active region is then oxidized to form a gate insulating layer. The formation of gate insulating layers having different thicknesses involves selective removal of a gate insulating layer and formation of a new gate insulating layer. The silicon oxide layer in the active region is etched together with the silicon oxide layer in the device isolation region.

When the height of the STI silicon oxide layer (STI oxide layer) 107 is controlled by over-etching of silicon oxide in the step of removing the buffer oxide layer 102 with a hydrofluoric acid solution, isotropic etching of the STI oxide layer 107 may cause a divot in an area surrounding the STI oxide layer 107. The formation of a deep divot may reduce the processing accuracy.

Japanese Laid-open Patent Publication No. 2002-151465 proposes that the thickness of an STI oxide layer should be controlled after CMP is performed in an STI process. Since the top surface is etched while a hard mask remains, a flat surface can be formed.

A hard mask layer composed of a polysilicon film and a silicon nitride film is formed on a buffer oxide layer. Steps corresponding to those illustrated in FIGS. 1A to 1E are preformed to form a flat surface by CMP. On the basis of the thickness of an exposed STI oxide layer, the silicon oxide layer is etched to have a desired thickness. The hard mask layer is then etched. The STI oxide layer can be etched with high precision after the thickness thereof is measured.

Japanese Laid-open Patent Publication No. 2004-71862 discloses a process for manufacturing a semiconductor device including the steps of forming a stopper layer of silicon nitride on a buffer oxide layer, performing steps corresponding to those illustrated in FIGS. 1A to 1E to expose the stopper layer by CMP, measuring the thickness of the stopper layer, and determining the wet-etch depth in the STI oxide layer on the basis of the average thickness of the stopper layer. The thickness of the STI oxide layer formed on the stopper layer and the thickness of the stopper layer removed by CMP depend on the area of an active region. Thus, measurement of the thickness of the stopper layer after CMP and before etching of an embedded oxide layer can reduce variations in STI height between individual wafers or lots of wafers. The layer whose thickness is to be measured is the embedded oxide layer in Japanese Laid-open Patent Publication No. 2002-151465 or the stopper layer in Japanese Laid-open Patent Publication No. 2004-71862.

Japanese Laid-open Patent Publication No. 2007-109966 discloses a process for manufacturing a semiconductor device including the steps of forming a stopper layer of silicon nitride on a buffer oxide layer, performing steps corresponding to those illustrated in FIGS. 1A to 1E to expose the stopper layer by CMP, removing the stopper layer by 50% or less of the initial thickness thereof, and wet-etching the STI oxide layer by 10% to 50% of the initial thickness of the silicon nitride stopper layer.

In another field of the art, the formation of multilayer interconnection on an interlayer insulating layer disposed on a silicon wafer may cause the silicon wafer to be warped outward owing to the stress caused by the interlayer insulating layer. The warping of the wafer increases with increasing wafer size.

Japanese Laid-open Patent Publication No. 2006-4982 discloses a process for manufacturing a semiconductor substrate including the steps of forming silicon oxide layers on the front and back sides of a silicon wafer by thermal oxidation, specifically, placing a plurality of silicon wafers in a vertical furnace, forming silicon nitride layers and silicon oxide layers on the front and back sides of the silicon wafer by batch-wise thermal CVD, and removing the silicon oxide layer formed on the front side of the silicon wafer by wet-etching using hydrofluoric acid. The silicon nitride layer formed on the front side of the silicon wafer functions as an etching mask and a CMP stopper. The silicon nitride layer formed on the back side of the silicon wafer prevents the silicon wafer from being warped. The silicon oxide layer formed on the silicon nitride layer on the back side of the silicon wafer functions as a layer that protects the silicon nitride layer on the back side of the silicon wafer while the silicon nitride layer on the front side of the silicon wafer is removed with hot phosphoric acid.

When the thickness of an STI oxide layer is controlled before the stopper layer is removed, the thickness of the STI oxide layer can be controlled by etching from above. However, even in this case, a gate electrode may not be patterned precisely.

SUMMARY

According to an aspect of an embodiment, there is a method for manufacturing a semiconductor device, including: forming first insulating layers as buffer layers over front and back sides of a semiconductor substrate; forming second insulating layers and third insulating layers over the first insulating layers in this order, the second insulating layers having different etching characteristics from the third insulating layers; measuring a thickness of one of the second insulating layers; removing the front side third insulating layer by etching and removing part of the front side second insulating layer by etching, the etch depth of the front side second insulating layer depending on the thickness of the second insulating layer measured in step (C); patterning the remaining front side second insulating layer and etching the semiconductor substrate using the patterned front side second insulating layer as a mask to form a device isolation trench; depositing a device isolation insulating film so as to fill the device isolation trench with a device isolation insulating layer and removing part of the device isolation insulating layer formed over the front side second insulating layer by polishing using the front side second insulating layer as a stopper; and removing the front side second insulating layer by etching.

DESCRIPTION OF THE PREFERRED EMBODIMENTS

The present inventor has investigated the cause of a difference in height between an STI device isolation region and an active region and variations in the height difference. A silicon nitride layer serving as both a hard mask and a stopper layer is used to form an STI trench. After the trench is formed, the trench is filled with an STI insulating layer, such as a silicon oxide layer. Part of the STI insulating layer formed on the stopper layer is removed by CMP. The stopper layer blocks the CMP. The surface after CMP becomes flat. However, removing the stopper layer by etching causes a difference in height corresponding to the thickness of the stopper layer. The thickness of a buffer oxide layer is negligibly small. Use of the stopper layer therefore necessarily causes a difference in height between the STI insulating layer and the active region.

The STI insulating layer not only has a difference in height, but also exhibits a wide range of variations in the height difference. Given that a difference in height results from the thickness of the stopper layer, the variations in the height difference are most likely caused by variations in the thickness of the stopper layer. The stopper layer is formed simultaneously on a plurality of wafers in a vertical furnace. For example, six lots of wafers (25 wafers per lot) are placed in a vertical furnace, and a silicon nitride layer is deposited on the front and back sides of each wafer by CVD. The silicon nitride layer on the back side functions as a stress balance layer.

Figure 2A:
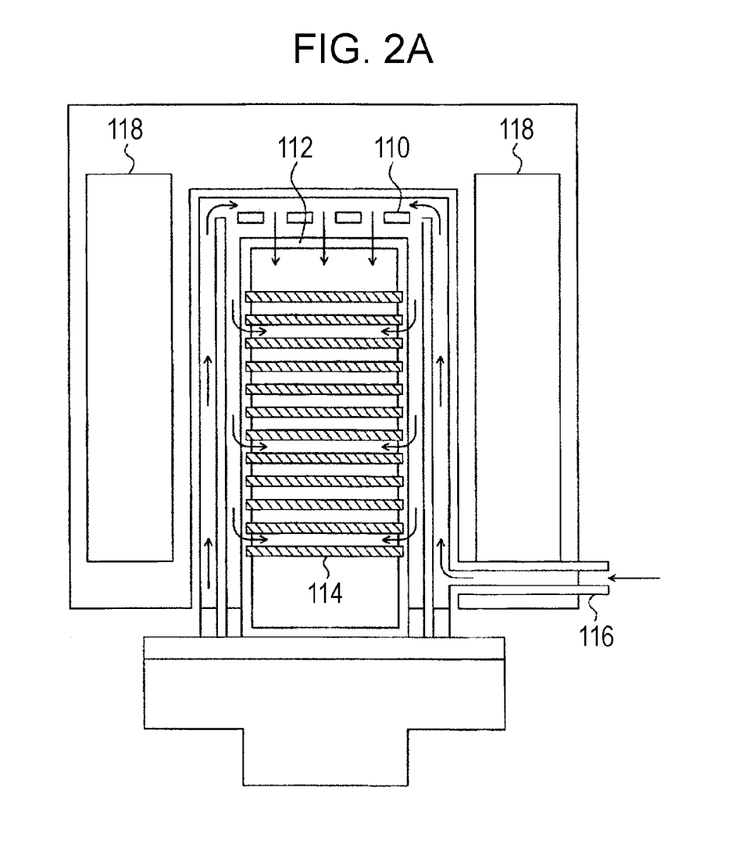
FIG. 2A is a schematic cross-sectional view of a vertical furnace used in CVD of a silicon nitride layer.

FIG. 2A is a schematic cross-sectional view of a vertical furnace used in CVD of a silicon nitride layer. A plurality of semiconductor (silicon) wafers 114 is held on a boat 112 within an inner tube of a reactor 110 having a double structure. For example, 150 silicon wafers are placed in parallel at intervals of several millimeters. A heater 118 disposed in an outer tube of the reactor 110 heats the inner tube. A gas inlet line is disposed between the inner tube and the outer tube and is connected to a gas supply pipe 116. A raw material gas from the gas supply pipe 116 is heated by the heater 118 and is introduced to the top of the reactor 110. The heater 118 is composed of five vertically arranged sections each having a thermocouple to measure the temperature of the respective sections. The temperatures of the five sections are controlled to adjust the thickness of a CVD film and the distribution of the thicknesses.

A silicon nitride layer serving as both a hard mask and a stopper layer and used to form an STI trench is not limited to a silicon nitride layer and may be a silicon oxynitride layer.

Figure 2B:
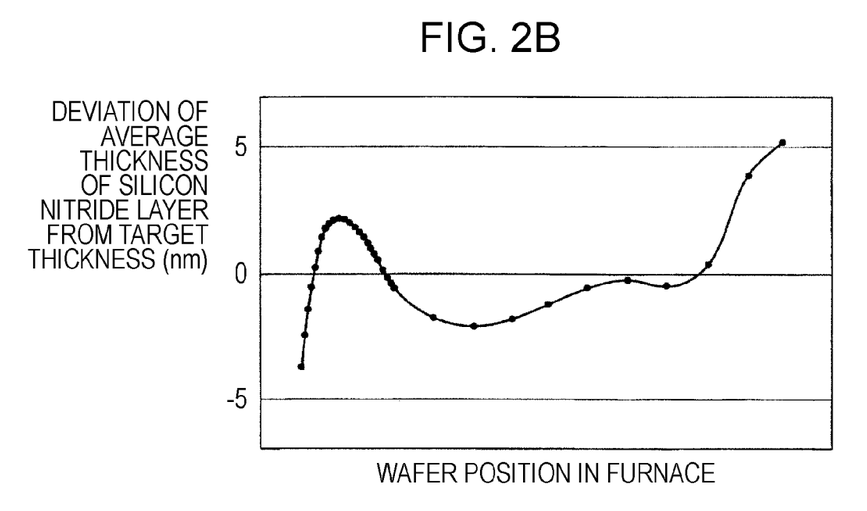
FIG. 2B is a graph showing the thickness deviation of a silicon nitride layer deposited on a batch of wafers from the target thickness of 80 nm as a function of the wafer position in the vertical furnace in CVD using dichlorosilane and ammonia as raw material gases.

FIG. 2B is a graph showing the thickness deviation of a silicon nitride layer deposited on a batch of wafers from the target thickness of 80 nm as a function of the wafer position in the vertical furnace in CVD using dichlorosilane as a raw material gas. The horizontal axis represents the height in the furnace, and the vertical axis represents the deviation of the average thickness of a silicon nitride layer from the target thickness, expressed in nm. The thickness deviation ranges from about −4 to about +5 nm. The distribution of the thickness deviation varies from lot to lot. The thickness deviation of a silicon nitride layer deposited by CVD in a vertical furnace is generally said to be ±10%. Thus, the maximum thickness is greater than the minimum thickness by about 20%. Variations in the thickness of the stopper layer of silicon nitride result in variations in the height of the STI oxide layer relative to the active region.

The present inventor proposes that the thickness of the silicon nitride layer should be measured immediately after the formation thereof and that the silicon nitride layer should be etched to the target thickness. Although measuring the thickness of the STI oxide layer after CMP and etching the STI oxide layer to the desired thickness can control the thickness of the residual layer, the cause of variations still remains. Thus, variations in the thickness of the stopper layer may still have adverse effects. Adjusting the thickness of the silicon nitride layer to the target value should eliminate the cause of variations in the height of the STI oxide layer and reduce the adverse effects.

FIGS. 3A to 3I are schematic cross-sectional views of a silicon wafer illustrating a method for manufacturing a semiconductor device according to an embodiment of the present invention.

Figure 3A:
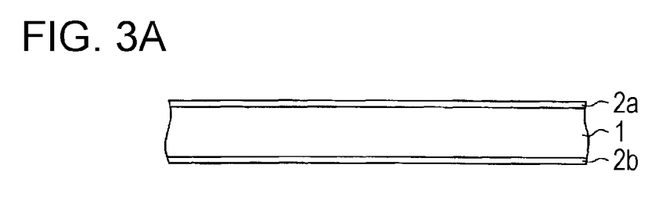
FIGS. 3A to 3I are schematic cross-sectional views of a silicon wafer illustrating a method for manufacturing a semiconductor device according to an embodiment.

As illustrated in FIG. 3A, the front and back sides of a silicon wafer (substrate) 1 placed in a vertical furnace are thermally oxidized to form a buffer silicon oxide layers 2a and 2b having a thickness of about 10 nm. The suffix "a" denotes a component on the front side, and the suffix "b" denotes a component on the back side. A component may be collectively referred to by a reference numeral without the suffixes. The buffer silicon oxide layers 2a and 2b protect the substrate surface from possible stress.

Figure 3B:
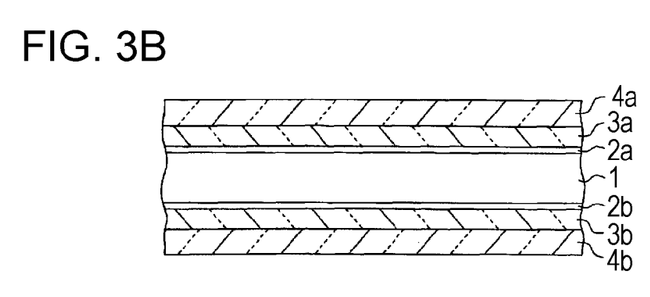

As illustrated in FIG. 3B, silicon nitride layers 3a and 3b having a thickness of 100 nm are formed on the buffer silicon oxide layers 2a and 2b by CVD using dichlorosilane as a raw material gas. The silicon nitride layer 3a on the front side functions as a hard mask in trench etching and as a stopper in CMP. The silicon nitride layer 3b on the back side prevents the substrate from being warped. Since the thickness of the silicon nitride layer 3a is adjusted by etching, the thickness (for example, 100 nm in the present embodiment) must be greater than the target thickness. For example, when the thickness deviation is ±8 nm, the silicon nitride layer 3a must have a thickness of a target value plus 10 nm.

Silicon oxide layers 4a and 4b having a thickness in the range of 150 to 400 nm are formed on the silicon nitride layers 3a and 3b by CVD using tetraethoxysilane (TEOS) and oxygen as raw material gases. The silicon oxide layers 4a and 4b are not limited to the TEOS oxide layers and may be other silicon oxide layers. The silicon oxide layer 4b on the back side protects the silicon nitride layer 3b while the silicon nitride layer 3a on the front side is removed with boiling phosphoric acid after STI. While the formation of the silicon oxide layer 4b accompanies the formation of the silicon oxide layer 4a on the front side, the silicon oxide layer 4a is unnecessary and is removed in a subsequent process.

Figure 3C:
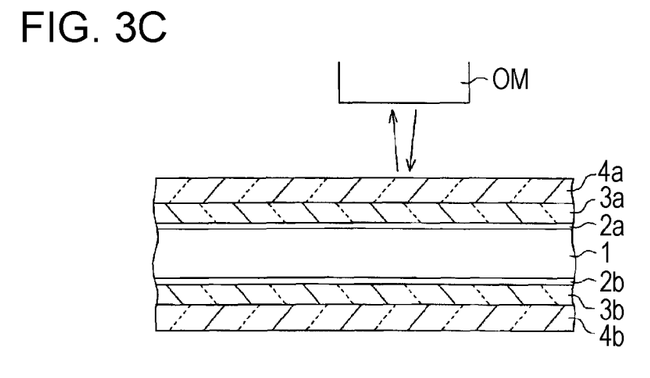

As illustrated in FIG. 3C, the silicon wafer is removed from the vertical furnace after CVD, and the thickness of the silicon nitride layer 3 is measured with an optical thickness meter OM. Since the silicon nitride layer whose thickness is controlled is the silicon nitride layer 3a on the front side, the thickness measurement is preferably performed in the silicon nitride layer 3a.

Figure 4A:
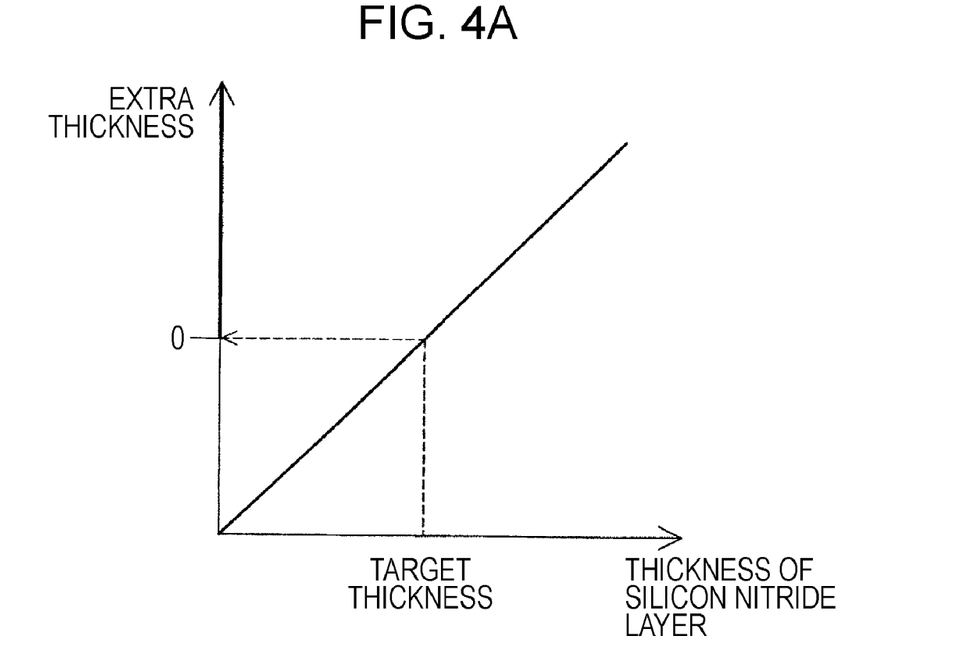
FIG. 4A is a graph showing the relationship between the thickness of a silicon nitride layer and the extra thickness.

FIG. 4A shows the relationship between the thickness of the silicon nitride layer and the extra thickness. The horizontal axis represents the thickness of the silicon nitride layer, and the vertical axis represents the extra thickness relative to the target value. The silicon nitride layer is formed such that it has an extra thickness relative to the target value. Part of the silicon nitride layer corresponding to the extra thickness is removed by etching to achieve the target thickness.

Hydrofluoric acid treatment is generally performed at a predetermined hydrofluoric acid concentration and temperature (for example, 50% HF:H$_2$O=1:3 at 23° C.). The etch depth depends on the treatment time. The TEOS oxide layer is removed at a high etch rate by the hydrofluoric acid treatment. The etching time is negligibly short.

The silicon nitride layer has a much lower etch rate than the silicon oxide layer, allowing controlled etching. Since the etching time of the silicon oxide layer is negligibly short, the etch depth of the silicon nitride layer can be controlled by the hydrofluoric acid treatment time.

Figure 4B:
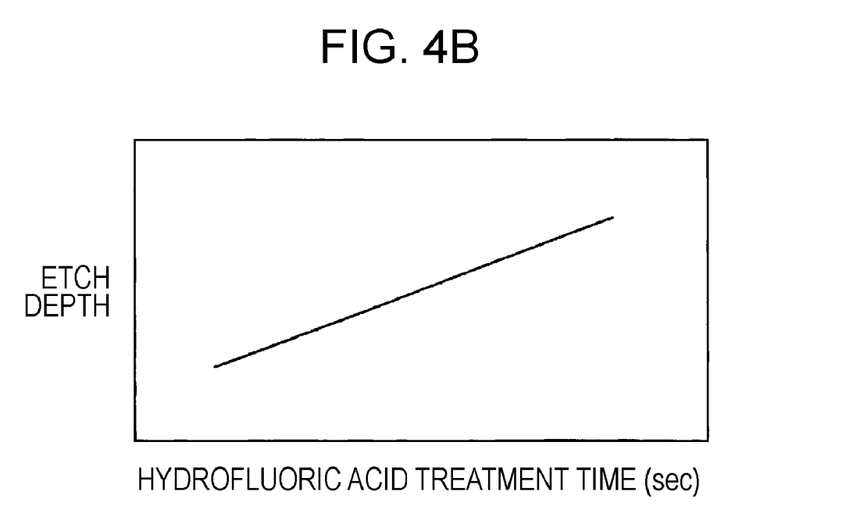
FIG. 4B is a graph showing the relationship between the hydrofluoric acid treatment time (horizontal axis) and the etch depth (vertical axis) of a silicon nitride layer.

FIG. 4B shows the relationship between the hydrofluoric acid treatment time (horizontal axis) and the etch depth (vertical axis) of a silicon nitride layer. There is an excellent linear relationship between the etch depth of the silicon nitride layer and the hydrofluoric acid treatment time. The required hydrofluoric acid treatment time can be determined by the extra thickness of the silicon nitride layer.

Figure 3D:
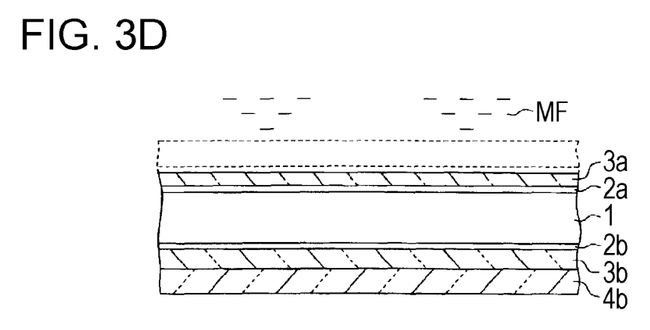

As illustrated in FIG. 3D, a hydrofluoric acid solution is added dropwise to the silicon wafer 1 to remove the TEOS oxide layer 4a on the front side while the silicon wafer 1 is rotated in a single-wafer wet processing apparatus. Part of the silicon nitride layer 3a having the extra thickness is then removed by controlled etching to adjust the thickness of the silicon nitride layer 3a to the target thickness. The TEOS oxide layer 4b on the back side of the silicon wafer 1 protects the silicon nitride layer 3b during the hydrofluoric acid treatment.

There is no additional step in the manufacturing process described above, except the thickness measurement and possible extension of the etching time. The thickness of the silicon nitride layer, which varied widely in the conventional processes, can be adjusted to the target value. While the hydrofluoric acid concentration and the temperature of a hydrofluoric acid solution are kept constant in the present embodiment, the etch depth may be controlled by these parameters. A STI device isolation region is then formed by a known method. The STI is performed only on the front side of the wafer. Since no change occurs on the back side, unless otherwise specified, the description concerning the back side will be omitted.

Figure 3E:
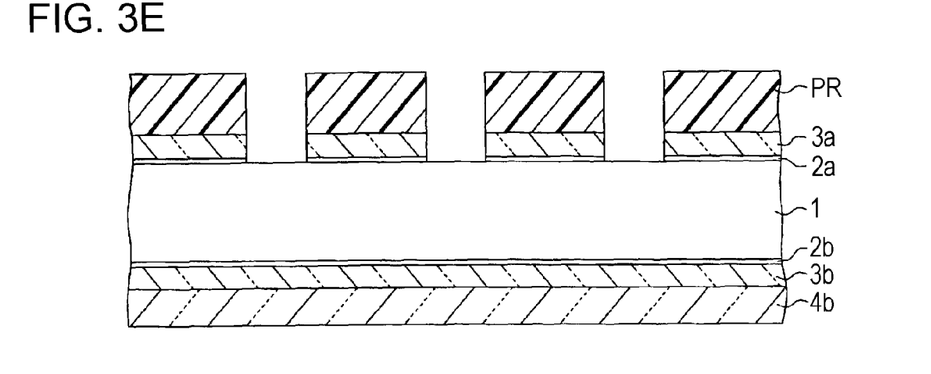

As illustrated in FIG. 3E, the silicon nitride layer 3a and the buffer silicon oxide layer 2a on the front side are anisotropically etched using a photoresist pattern PR as an etching mask to leave part of the silicon nitride layer 3a and the buffer silicon oxide layer 2a covering the active region, thus forming a hard mask. The photoresist pattern PR is then removed by ashing.

Figure 3F:
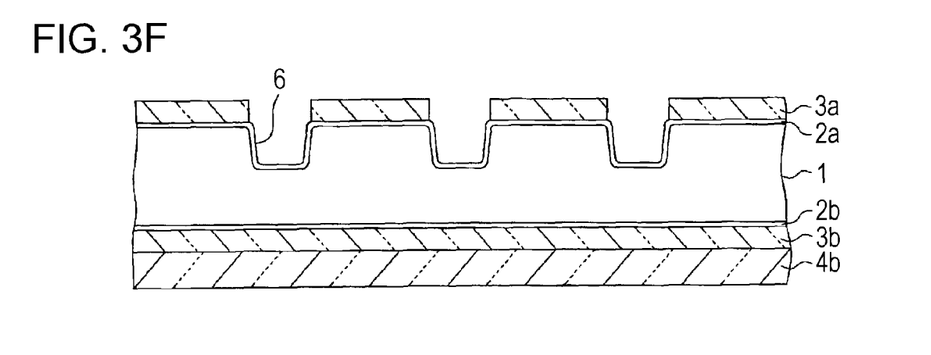

As illustrated in FIG. 3F, the silicon wafer 1 is etched using the silicon nitride layer 3a as an etching mask to form a device isolation trench, for example, having a depth in the range of 250 to 350 nm. The surface of the silicon wafer 1 is then oxidized under dry conditions to form a silicon oxide liner 6 in the device isolation trench. The dry oxidation may be performed by a batch process in a vertical furnace.

Figure 3G:
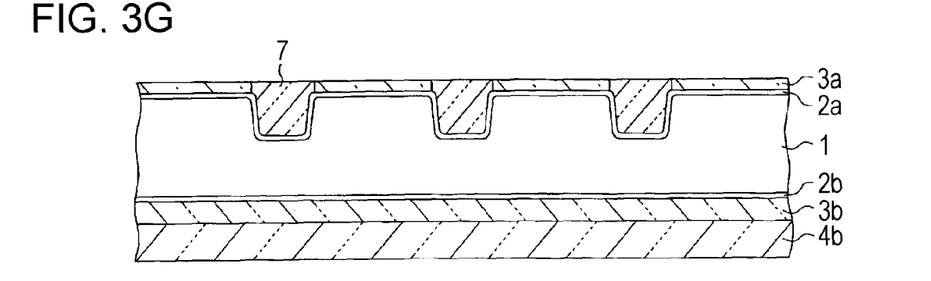

As illustrated in FIG. 3G, the device isolation trench is filled with a silicon oxide insulating layer 7 having a sufficient thickness, for example, in the range of 300 to 500 nm by high-density plasma (HDP). The silicon oxide insulating layer 7 is also formed on the silicon nitride layer 3a. Unnecessary part of the silicon oxide insulating layer 7 is removed by CMP using the silicon nitride layer 3a as a stopper. Since the silicon nitride layer 3a has the target thickness after the etching step illustrated in FIG. 3D, the silicon nitride layer 3a after CMP also has the target thickness.

Figure 3H:
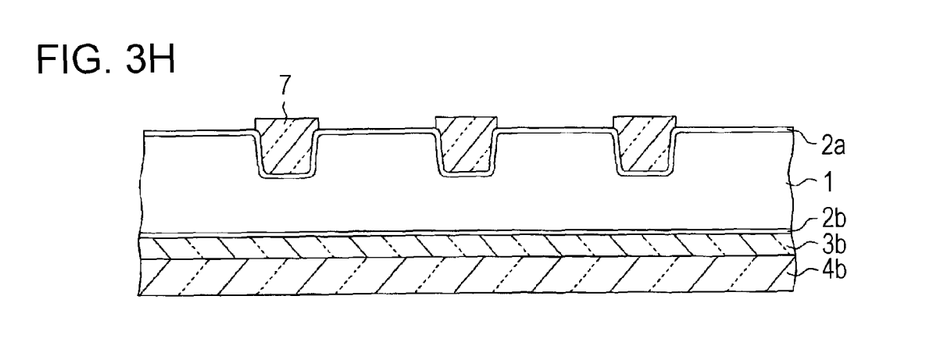

As illustrated in FIG. 3H, the silicon nitride layer 3a is removed with boiling phosphoric acid, while the silicon nitride layer 3b on the back side is protected by the silicon oxide layer 4b. The buffer silicon oxide layer 2a is then removed with a hydrofluoric acid solution. Since the silicon nitride layer 3a has the target thickness, the silicon oxide insulating layer 7 also has a target height relative to the active region.

A MOS transistor and multilayer interconnection are formed by a known process on the silicon wafer having the STI device isolation region.

Figure 3I:
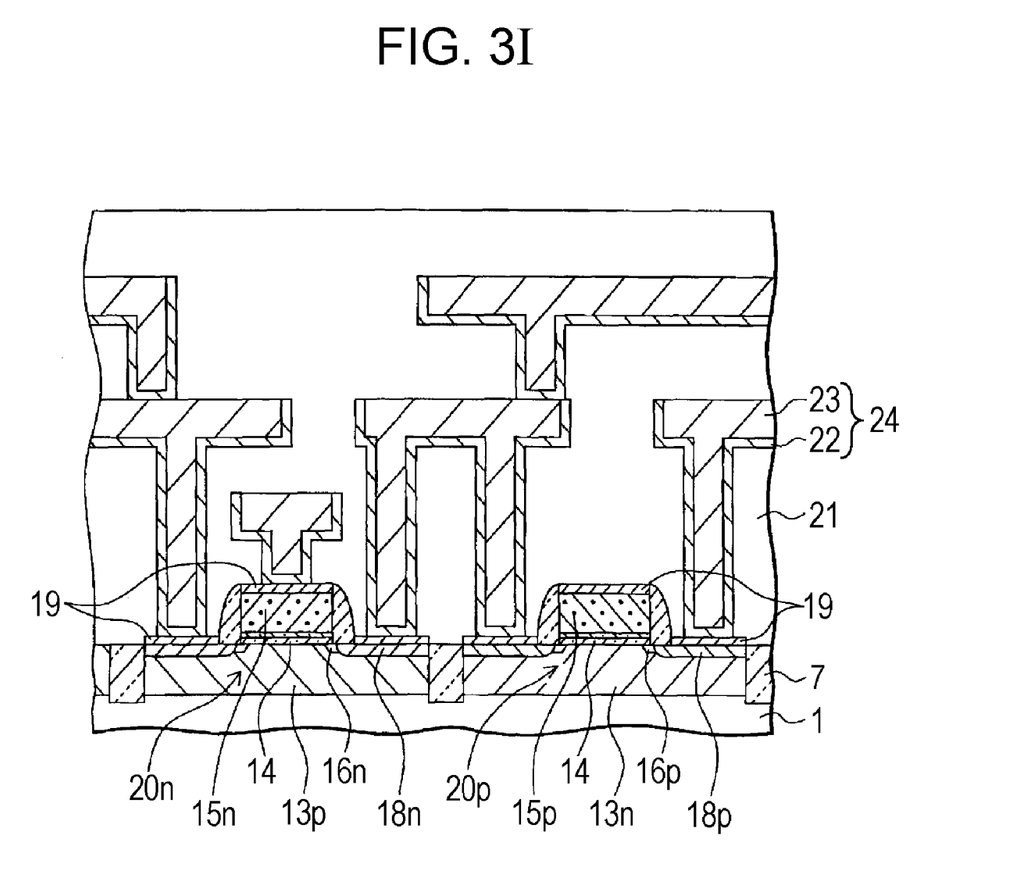

As illustrated in FIG. 3I, an n-type well 13n and a p-type well 13p are formed in the silicon wafer 1. A gate insulating layer 14 is formed on the active region. The gate insulating layer 14, as in an n-channel IG-FET 20n and a p-channel IG-FET 20p, is composed of dielectric insulating layers formed on the silicon oxide layer having a limited thickness. The n-channel IG-FET 20n is composed of an n-type polysilicon gate electrode 15n, an n-type extension region 16n, and an n-type source/drain region 18n formed on the p-type well 13p. The p-channel IG-FET 20p is composed of a p-type polysilicon gate electrode 15p, a p-type extension region 16p, and a p-type source/drain region 18p formed on the n-type well 13n. A silicide layer 19 is formed on the polysilicon gate electrode 15 and the source/drain region 18. The suffixes p and n in the reference numeral indicate the conductive type. The conductive type of the semiconductor regions in the p-channel IG-FET 20p is the reverse of that in the n-channel IG-FET 20n.

The polysilicon gate electrode 15 is covered with an interlayer insulating layer 21. A multilayer interconnection 24 is formed in the interlayer insulating layer. The multilayer interconnection 24 is composed of a barrier metal layer 22 and a main wiring layer 23, for example, formed of copper.

While the hydrofluoric acid treatment is controlled by the treatment time in the present embodiment, it may be controlled by the hydrofluoric acid concentration or the temperature of a hydrofluoric acid solution or a combination of the treatment time, the hydrofluoric acid concentration, and the temperature of a hydrofluoric acid solution.

While the thickness of the silicon nitride layer 3 is measured after the silicon oxide layer 4 is formed on the silicon nitride layer 3 by CVD, the thickness of the silicon nitride layer 3 can be measured more precisely before the deposition of the silicon oxide layer 4.

Figure 5A:
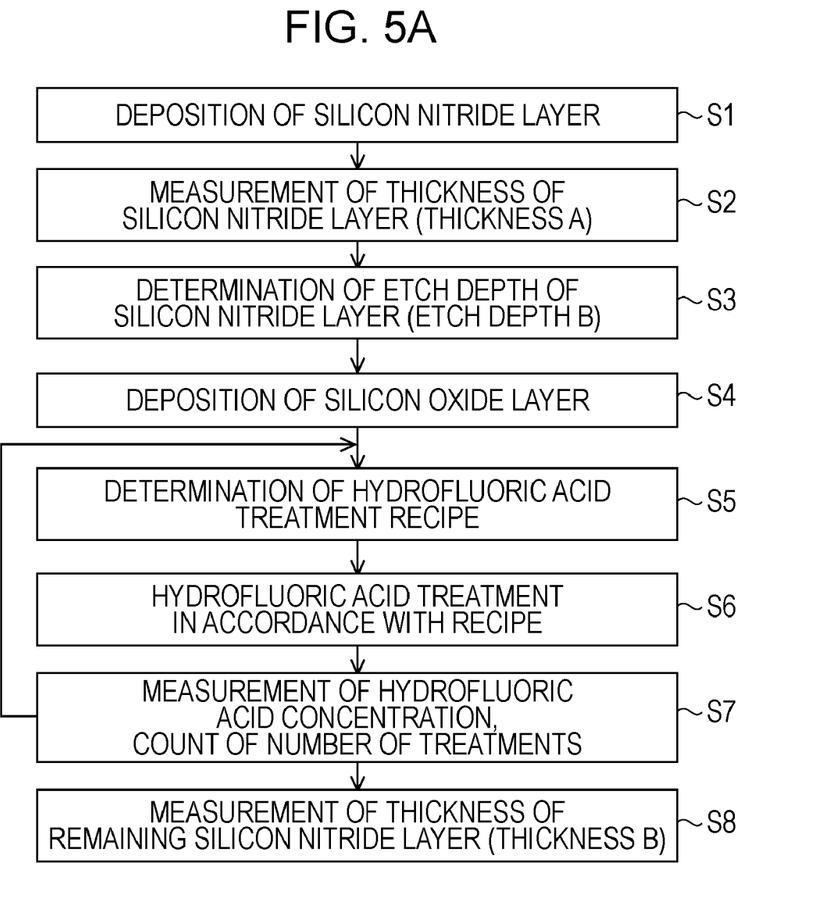
FIG. 5A is a flow chart of main steps in a method for manufacturing a semiconductor device according to a modified embodiment.

FIG. 5A is a flow chart of main steps in a method for manufacturing a semiconductor device according to a modified embodiment of the present invention. In step S1, a silicon nitride layer 3 is deposited on a thermally oxidized layer 2 formed on a silicon substrate 1 in a film-forming apparatus, such as a vertical furnace. The silicon nitride layer 3 may be formed only on the front side (3a) or on both sides (3a and 3b) of the silicon substrate 1.

After the silicon substrate 1 is removed from the film-forming apparatus, the thickness of the silicon nitride layer 3 is measured (step S2).

Figure 5B:
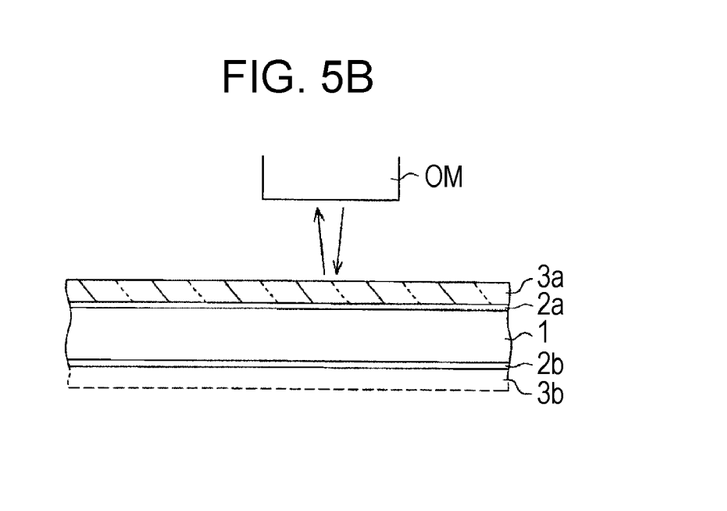
FIG. 5B is a cross-sectional view of a silicon wafer illustrating the optical thickness measurement in step S2.

As illustrated in FIG. 5B, the thickness of the silicon nitride layer 3a is measured with an optical thickness meter OM (thickness A). As described above, since the silicon oxide layer 4a is not formed yet, the thickness of the silicon nitride layer 3a can be measured with high precision.

In step S3, the etch depth B of the silicon nitride layer 3a is determined from the thickness A and the target thickness. In step S4, a silicon oxide layer 4 is formed on the silicon nitride layer 3 in a film-forming apparatus, such as a vertical furnace.

In step S5, a hydrofluoric acid treatment recipe is determined from the etch depth B in a hydrofluoric acid treatment apparatus. The recipe includes the treatment (etching) time, the hydrofluoric acid concentration, and the temperature of a hydrofluoric acid solution. All these three parameters may be variable, or only the treatment time may be variable. Alternatively, the hydrofluoric acid concentration and the temperature of a hydrofluoric acid solution may be selected from a plurality of data sets. In step S6, a hydrofluoric acid treatment is performed in accordance with the recipe. More specifically, the silicon oxide layer 4a on the front side is removed, and part of the silicon nitride layer 3a corresponding to the predetermined thickness is removed.

The hydrofluoric acid solution may be reused. The properties of the hydrofluoric acid solution change with the number of times the solution is used. The hydrofluoric acid solution is discarded via a buffer tank. The properties of the hydrofluoric acid solution in the buffer tank also change over time. A hydrofluoric acid solution has a lifetime, which indicates an available time (the number of times), or a life count, which indicates the current position in the available time. For example, the lifetime of a hydrofluoric acid treatment that is replaced once a day is 24 hours.

Figure 6A:
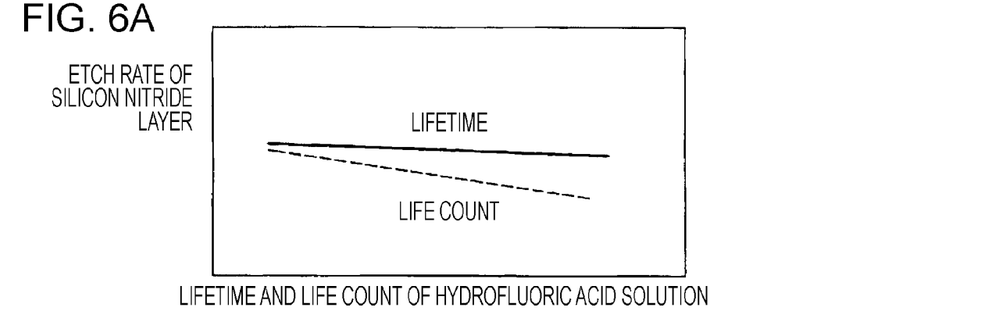
FIG. 6A is a graph showing the relationship between the lifetime or life count of a hydrofluoric acid solution and the etch rate of a silicon nitride layer.

FIG. 6A shows the relationship between the lifetime or life count of a hydrofluoric acid solution and the etch rate of the silicon nitride layer. The etch rate of the silicon nitride layer decreases slightly with increasing lifetime. The etch rate of the silicon nitride layer decreases with increasing life count. These characteristics are preferably considered in the hydrofluoric acid treatment recipe.

In step S7, the hydrofluoric acid concentration after the hydrofluoric acid treatment is measured, and the number of treatments is counted. These parameters are fed back to the hydrofluoric acid treatment apparatus and are considered in the following hydrofluoric acid treatment recipe. In step S8, the thickness of the remaining silicon nitride layer is measured. When the etch depth B is satisfied, the process is completed.

Figure 6B:
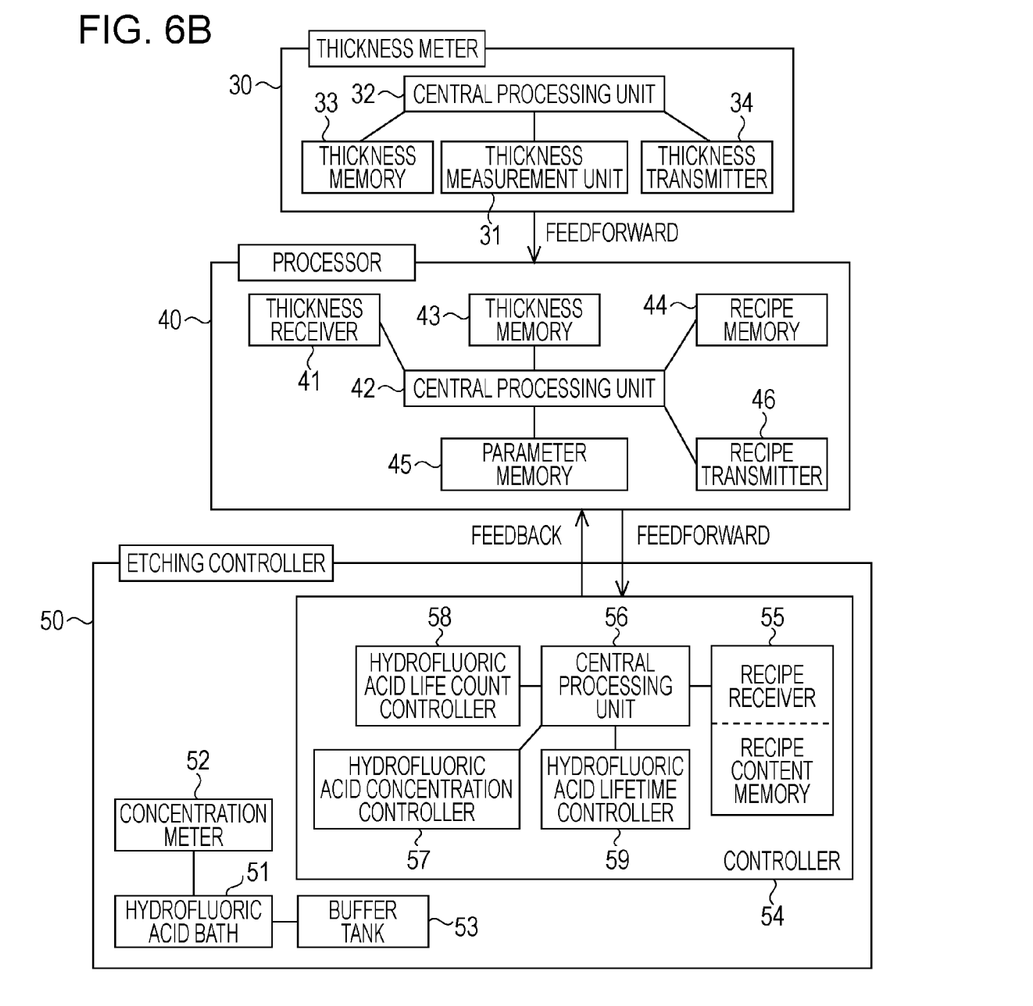
FIG. 6B is a block diagram of a hydrofluoric acid treatment system.

FIG. 6B is a block diagram of a hydrofluoric acid treatment system for performing such treatment. The system includes a thickness meter 30, a processor 40, and an etching controller 50. The thickness meter 30 includes a thickness measurement unit 31, a central processing unit 32, a thickness memory 33, and a thickness transmitter 34. The thickness measured by the thickness measurement unit 31 is memorized in the thickness memory 33 and is transmitted from the thickness transmitter 34. The processor 40 includes a thickness receiver 41, a central processing unit 42, a thickness memory 43, a recipe memory 44, a parameter memory 45, and a recipe transmitter 46. The film thickness received by the thickness receiver 41 is memorized in the thickness memory 43. A recipe is determined from information stored on the recipe memory 44, which memorizes the etching recipe, and information stored on the parameter memory 45, which memorizes the etching conditions, such as the relationship between the etching time and the etch depth. The recipe is transmitted from the recipe transmitter 46. The etching controller 50 includes a hydrofluoric acid bath 51, a concentration meter 52, a buffer tank 53, and a controller 54. The controller 54 includes a recipe receiver 55 optionally having a recipe content memory, a central processing unit 56, a hydrofluoric acid concentration controller 57, a hydrofluoric acid life count controller 58, and a hydrofluoric acid lifetime controller 59.

The central processing unit 56 controls the hydrofluoric acid treatment in accordance with the recipe received by the recipe receiver 55. When only the name of a recipe is transmitted, the recipe content memory reads out the content of a recipe having the name. After the hydrofluoric acid treatment is completed, the hydrofluoric acid life count controller 58 updates the life count, the hydrofluoric acid lifetime controller 59 updates the lifetime, the concentration meter 52 measures the hydrofluoric acid concentration, and the hydrofluoric acid concentration controller 57 memorizes the hydrofluoric acid concentration.

While the present invention has been described with reference to the preferred embodiments, the present invention is not limited to these embodiments. A person skilled in the art will recognize that various modifications, substitutions, combinations, and improvements can be made in the embodiments.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A method for manufacturing a semiconductor device, comprising:
    (a) forming first insulating layers as buffer layers over front and back sides of a semiconductor substrate;
    (b) forming second insulating layers and third insulating layers over the first insulating layers in this order, the second insulating layers having different etching characteristics from the third insulating layers;
    (c) measuring a thickness of one of the second insulating layers;
    (d) removing the front side third insulating layer by etching and removing part of the front side second insulating layer by etching, the etch depth of the front side second insulating layer depending on the thickness of the second insulating layer measured in step (c);
    (e) patterning the remaining front side second insulating layer and etching the semiconductor substrate using the patterned front side second insulating layer as a mask to form a device isolation trench;
    (f) depositing a device isolation insulating film so as to fill the device isolation trench with a device isolation insulating layer and removing part of the device isolation insulating layer formed over the front side second insulating layer by polishing using the front side second insulating layer as a stopper; and
    (g) removing the front side second insulating layer by etching.

2. The method for manufacturing a semiconductor device according to claim 1, wherein the etch depth of the second front side insulating layer is controlled with an etchant and the etchant is the same used to remove the third front side insulating layer.

3. The method for manufacturing a semiconductor device according to claim 2, further comprising
    measuring a number of treatments performed using the etchant and measuring a concentration of the etchant.

4. The method for manufacturing a semiconductor device according to claim 1, wherein
    the second insulating layers are a silicon nitride, and the third insulating layers are a TEOS oxide, and
    in removing part of the front side second insulating layer, the removing is a hydrofluoric acid treatment.

5. The method for manufacturing a semiconductor device according to claim 1, wherein removing the front side second insulating layer includes using boiling phosphoric acid while the third insulating layer on the back side protects the underlying back side second insulating layer.

6. A method for manufacturing a semiconductor device, comprising:
    (a) forming a first insulating layer as a buffer layer on a front side of a semiconductor substrate;
    (b) forming a second insulating layer and a third insulating layer on the first insulating layer in this order, the second insulating layer having different etching characteristics from the third insulating layer;
    (c) measuring the thickness of the second insulating layer;
    (d) removing the third insulating layer by etching and removing part of the second insulating layer by etching, the etch depth of the second insulating layer depending on the thickness of the second insulating layer measured in step (c);
    (e) patterning the remaining second insulating layer and etching the semiconductor substrate using the patterned second insulating layer as a mask to form a device isolation trench;
    (f) filling the device isolation trench with a device isolation insulating layer and removing part of the device isolation insulating layer formed on the second insulating layer by polishing using the second insulating layer as a stopper; and
    (g) removing the second insulating layer by etching.

7. The method for manufacturing a semiconductor device, according to claim 6, wherein the etching of the second insulating layer is controlled and is etched with an etchant that is used to remove the third insulating layer.

* * * * *